United States Patent
Kozhukh et al.

(10) Patent No.: US 10,037,889 B1
(45) Date of Patent: Jul. 31, 2018

(54) CATIONIC PARTICLE CONTAINING SLURRIES AND METHODS OF USING THEM FOR CMP OF SPIN-ON CARBON FILMS

(71) Applicant: Rohm and Haas Electronic Materials CMP Holdings, Inc., Newark, DE (US)

(72) Inventors: Julia Kozhukh, Bear, DE (US); Lee Melbourne Cook, Atglen, PA (US); Michael E. Mills, Midland, MI (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/472,976

(22) Filed: Mar. 29, 2017

(51) Int. Cl.
| | |
|---|---|
| H01L 21/304 | (2006.01) |
| C09G 1/02 | (2006.01) |
| H01L 21/308 | (2006.01) |
| H01L 21/311 | (2006.01) |
| H01L 21/3213 | (2006.01) |
| G03F 7/16 | (2006.01) |
| G03F 7/38 | (2006.01) |
| G03F 7/20 | (2006.01) |
| G03F 7/26 | (2006.01) |

(52) U.S. Cl.
CPC .............. *H01L 21/304* (2013.01); *C09G 1/02* (2013.01); *G03F 7/162* (2013.01); *G03F 7/168* (2013.01); *G03F 7/20* (2013.01); *G03F 7/26* (2013.01); *G03F 7/38* (2013.01); *H01L 21/3081* (2013.01); *H01L 21/31105* (2013.01); *H01L 21/31144* (2013.01); *H01L 21/3213* (2013.01); *H01L 21/32139* (2013.01)

(58) Field of Classification Search
CPC .............. H01L 21/304; H01L 21/3081; H01L 21/3213; H01L 21/31105; H01L 21/31144; H01L 21/32139; G03F 7/38; G03F 7/162; G03F 7/20; G03F 7/26; G03F 7/168; C09G 1/02
See application file for complete search history.

(56) References Cited

U.S. PATENT DOCUMENTS

| | | | |
|---|---|---|---|
| 5,597,442 A | 1/1997 | Chen et al. | |
| 5,643,050 A * | 7/1997 | Chen | B24B 37/015 451/10 |
| 6,153,525 A | 11/2000 | Hendricks et al. | |
| 6,270,395 B1 | 8/2001 | Towery et al. | |
| 6,315,635 B1 | 11/2001 | Lin | |
| 6,358,853 B2 | 3/2002 | Cadien et al. | |
| 6,723,143 B2 | 4/2004 | Towery et al. | |
| 6,736,992 B2 | 5/2004 | Zhang et al. | |
| 6,830,503 B1 | 12/2004 | Grumbine | |
| 7,052,373 B1 | 5/2006 | Yang et al. | |
| 7,144,814 B2 | 12/2006 | Jacquinot et al. | |
| 7,294,044 B2 | 11/2007 | Ferranti | |
| 7,390,748 B2 | 6/2008 | MacDonald | |
| 7,695,637 B2 | 4/2010 | Park et al. | |
| 8,449,636 B2 | 5/2013 | Song | |
| 8,685,857 B2 | 4/2014 | Matsui et al. | |
| 8,961,807 B2 | 2/2015 | Fu et al. | |
| 9,343,326 B2 | 5/2016 | Kim et al. | |
| 9,434,859 B2 | 9/2016 | Pallikkara Kuttiatoor et al. | |
| 9,783,702 B1 * | 10/2017 | Guo | C09G 1/02 |
| 2003/0162399 A1 * | 8/2003 | Singh | C09G 1/02 438/692 |
| 2006/0124592 A1 | 6/2006 | Miller et al. | |
| 2009/0068840 A1 | 3/2009 | Minamihaba et al. | |
| 2009/0081377 A1 * | 3/2009 | Kubo | C08F 2/48 427/496 |
| 2010/0279435 A1 | 11/2010 | Xu et al. | |
| 2015/0311093 A1 | 10/2015 | Li et al. | |
| 2015/0376460 A1 * | 12/2015 | Grumbine | B24B 1/00 252/79.1 |
| 2016/0068711 A1 | 3/2016 | Choi et al. | |

FOREIGN PATENT DOCUMENTS

| | | |
|---|---|---|
| CN | 102465945 A | 5/2012 |
| JP | 2007138133 A | 6/2007 |
| JP | 2010056199 A | 3/2010 |
| KR | 627589 B1 | 9/2006 |
| KR | 2008037802 A | 5/2008 |
| WO | 2014079144 A1 | 5/2014 |

* cited by examiner

*Primary Examiner* — Nadine Norton
*Assistant Examiner* — Mahmoud Dahimene
(74) *Attorney, Agent, or Firm* — Andrew Merriam; John J. Piskorski

(57) ABSTRACT

The present invention provides methods for chemical mechanical polishing (CMP polishing) spin coated organic polymer films on a semiconductor wafer or substrate as part of lithography or as part of electronic packaging. The methods comprising spin coating an organic polymer liquid on a semiconductor wafer or substrate; at least partially curing the spin coating to form an organic polymer film; and, CMP polishing the organic polymer film with a polishing pad and an aqueous CMP polishing composition having a pH ranging from 1.5 to 4.5 and comprising elongated, bent or nodular silica particles containing one or more cationic nitrogen or phosphorus atoms, from 0.005 to 0.5 wt. %, based on total CMP polishing composition solids, of a sulfate group containing $C_8$ to $C_{18}$ alkyl or alkenyl group surfactant, and a pH adjusting agent.

10 Claims, No Drawings

CATIONIC PARTICLE CONTAINING SLURRIES AND METHODS OF USING THEM FOR CMP OF SPIN-ON CARBON FILMS

The present invention relates to methods comprising chemical mechanical polishing (CMP) of organic polymer films on semiconductor wafer substrates with abrasive compositions containing cationic silica particles and a sulfate group containing surfactant, which methods exhibit high removal rates and high substrate removal selectivity.

In the semiconductor and electronic device industry, chemical mechanical polishing (CMP) is used to planarize and polish and/or remove layers formed during the fabrication process. In fabricating some of those layers, spin-on carbon (SOC) coatings made from organic polymer liquid spin coating compositions produce films useful as sacrificial layers or masks in photolithography for making, for example, semiconductor substrates for use in memory or logic applications. Spin-on dielectric (SOD) coatings are useful as insulating layers or redistribution layers in the process of packaging electronics substrates, such as for optoelectronic applications.

In photolithography applications, for example, there remains a need for effective chemical mechanical planarization on a die scale and on a wafer scale in SOC films to satisfy depth of focus requirements. To date, CMP of SOC films has relied on slurries containing high concentrations of abrasive and/or containing oxidants to effect the desired removal. Such slurries also cause scratches and other defects and contribute to a high cost in use.

U.S. Pat. No. 7,390,748 B2, to MacDonald, discloses methods for semiconductor wafer polishing wherein the abrasive slurry may contain silica particles and a surfactant, such as a quaternary ammonium salt, which helps inhibit undesired polishing in recessed or lower density areas of the wafer. In the compositions of MacDonald, the slurry composition used in polishing has a pH between that of the isoelectric point of the wafer surface and that of the abrasive in the particles. As a result, the slurry has a surface charge opposite that of the substrate; however, the surfactants have the same surface charge as the abrasive particles used therein, thereby inhibiting polishing. The disclosure and the compositions in MacDonald do not address the polishing of organic polymer substrates.

The present inventors have endeavored to solve the problem of providing CMP polishing methods that enable more consistent and more highly tunable polishing performance in polishing organic substrates, e.g. polymers, at low silica solids contents.

STATEMENT OF THE INVENTION

1. In accordance with the present invention, methods comprise spin coating to form an organic polymer liquid on a semiconductor wafer or substrate, such as patterned or unpatterned silicon wafers, gallium-arsenide wafers, or silicon-germanium wafers, at least partially curing the spin coating to form an organic polymer film, for example, at a temperature ranging from 70 to 375° C., or, preferably, from 90 to 350° C.; and, chemical mechanical polishing (CMP polishing) the organic polymer film with a CMP polishing pad and an aqueous CMP polishing composition comprising from 0.05 to 7 wt. % or, preferably, from 0.1 to 4 wt. %, based on total CMP polishing composition solids, of an abrasive of elongated, bent or nodular silica particles containing within at least one of the silica particles one or more cationic nitrogen or phosphorus atoms, preferably, one or more cationic nitrogen atoms, or, more preferably, the silica particles having a zeta potential (ZP) at a pH of 3.3 of from 8 to 50 mV, or even more preferably, a ZP of from 17 to 26 mV, from 0.005 to 0.5 wt. % or, preferably, from 0.01 to 0.1 wt. %, based on total CMP polishing composition solids, of a sulfate group containing surfactant which further contains a $C_8$ to $C_{18}$ alkyl or alkenyl group, preferably, a $C_{12}$ to $C_{14}$ alkyl or alkenyl group, and a pH adjusting agent, such as an inorganic acid, the composition having a pH ranging from 1.5 to 4.5 or, preferably, from 1.5 to 3.5, wherein the pH is below the isoelectric point (IEP) of the silica particles.

2. In accordance with the methods of the present invention as set forth in item 1, above, wherein the organic polymer film is a spin-on coating (SOC) used in a lithography application, the methods further comprise: (a) exposing the polished organic polymer film to activating radiation through a mask; and, (b) contacting the organic polymer film layer with a developer to form a lithographic pattern, wherein the CMP polishing takes place either prior to or after the (a) exposing.

3. In accordance with the methods of the present invention as set forth in item 1, above, wherein the organic polymer film is a spin-on coating (SOC) used in a lithography application and the methods further comprise: (a) forming a topcoat layer over the organic polymer film; (b) exposing the topcoat layer and the organic polymer film to activating radiation through a mask; and (c) contacting the exposed topcoat layer and organic polymer film layer with a developer to form a lithographic pattern, wherein the CMP polishing takes place prior to or after the (b) exposing and before (a) forming the topcoat layer, wherein the CMP polishing takes place prior to or after the (b) exposing and after (a) forming the topcoat layer.

4. In accordance with the methods of the present invention as set forth in item 1, above, wherein the organic polymer film is a spin-on coating (SOC) used in a lithography application and, following the CMP polishing, the method further comprises (a) exposing the polished organic polymer film to activating radiation; and (b) contacting the organic polymer film layer with a developer to form a lithographic pattern.

5. In accordance with the methods of the present invention as set forth in any one of items 1, 2, 3 or 4, wherein the organic polymer film is a spin-on coating comprising a polymer chosen from a polyarylene, a polyarylene ether, a cross-linked polyarylene, a cross-linked polyarylene ether, a novolac or a phenolic epoxy.

6. In accordance with the methods of the present invention as set forth in any one of items 1, 2, 3, 4 or 5, wherein the semiconductor wafer or substrate additionally comprises an inorganic oxide, such as silicon dioxide, an inorganic oxide and a conductive layer, such as copper or polysilicon, an inorganic oxide and a dielectric, such as a nitride, or an inorganic oxide, a dielectric and a conductive layer.

7. In accordance with the methods of the present invention as set forth in item 6, wherein CMP polishing is continued until the surface of the organic polymer film has been polished down to planarize the organic polymer film and/or to expose the inorganic oxide, or the inorganic oxide and any or both of the dielectric and the conductive layer.

8. In accordance with the methods of the present invention as set forth in item 1, wherein the organic polymer film is a spin-on dielectric (SOD) that is spin coated on an electronic packaging substrate comprising an inorganic oxide, such as silicon dioxide and/or a conductive layer, such as copper or polysilicon.

9. In accordance with the methods of the present invention as set forth in any one of items 1 or 8, wherein the organic polymer film is chosen from a polyimide, an epoxy, such as a novolac epoxy, or a polybenzoxazole, preferably, wherein curing the organic polymer film comprises partially curing at a temperature of from 80 to 180° C. for 30 seconds to 20 minutes, such as 1 minute or longer, followed by CMP polishing the organic polymer film, and, wherein the methods further comprise fully curing the organic polymer films after CMP polishing the substrate.

10. In accordance with the methods of the present invention as set forth in any one of items 1, 8 or 9, wherein the semiconductor wafer or substrate comprises an inorganic oxide, such as silicon dioxide, an inorganic oxide and a conductive layer, such as copper, an inorganic oxide and a dielectric, such as a nitride, or an inorganic oxide, a dielectric and a conductive layer.

11. In accordance with the methods of the present invention as set forth in item 10, wherein CMP polishing is continued until the surface of the organic polymer film has been polished down to expose the inorganic oxide, or the inorganic oxide and the conductive layer, or the inorganic oxide and the dielectric.

12. In accordance with the methods of the present invention as in any one of items 1, 2, 3, 4, 5, 6, 7, 8, 9, 10, or 11, above, wherein in the aqueous CMP polishing compositions the one or more cationic nitrogen atoms comes from an aminosilane or an ammonium compound that contains one or more cationic nitrogen atoms at the pH of the aqueous CMP polishing composition, preferably, wherein the one or more cationic nitrogen atoms is a quaternary ammonium atom, or, more preferably, a cationic nitrogen atom of tetramethylammonium.

13. In accordance with the methods of the present invention as in any one of items 1, 2, 3, 4, 5, 6, 7, 8, 9, 10, 11, or 12, above, wherein in the aqueous CMP polishing compositions, the one or more cationic nitrogen atoms comes from cationic particles formed with tetramethoxy silane (TMOS) and an amine containing alkaline catalyst containing a quaternary ammonium atom, such as tetramethylammonium hydroxide.

14. In accordance with the methods of the present invention as in any one of items 1, 2, 3, 4, 5, 6, 7, 8, 9, 10, 11, 12, or 13, above, wherein in the aqueous CMP polishing compositions, the pH adjusting agent is an inorganic acid chosen from nitric acid and/or phosphoric acid.

15. In accordance with the methods of the present invention the present invention as in any one of items 1 to 14, above, wherein the aqueous CMP polishing compositions, are substantially free of any oxidizer compound, such as hydrogen peroxide.

Preferably, in the methods in accordance with the present invention, the ratio of abrasive elongated, bent or nodular silica particle solids to sulfate group containing surfactant solids in the CMP polishing compositions ranges from 4:1 to 35:1, or, preferably, 5:1 to 31:1; more preferably, such CMP polishing compositions comprise from 0.1 to 4 wt. %, as solids, of elongated, bent or nodular silica particle abrasives, or, most preferably, such CMP polishing compositions comprise from 0.1 to 2 wt. %, as solids, of elongated, bent or nodular silica particle abrasives having a zeta potential (ZP) at a ZP at pH of 3.3 of from 17 to 26 mV.

Preferably, in the methods in accordance with the present invention, the ratio of abrasive silica particle solids to sulfate group containing surfactant solids in the CMP polishing compositions ranges from 5:1 to 120:1; more preferably, such CMP polishing compositions comprise from 0.4 to 3 wt. % silica particle abrasive, as solids.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "elongated, bent or nodular silica particles" refers to silica particles having an aspect ratio of longest dimension to the diameter which is perpendicular to the longest dimension of from 1.8:1 to 3:1.

As used herein, the term "hard base" refers to metal hydroxides, including alkali(ne earth) metal hydroxides, such as NaOH, KOH, or $Ca(OH)_2$.

As used herein, the term "isoelectric point" refers to the pH level of a given surface or material at which the charge of that surface or material is neutral. Below the isolectric point, the charge of the given surface is positive.

As used herein, the term "ISO" refers to publications of the International Organization for Standardization, Geneva, CH.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "semiconductor wafer" is intended to encompass a semiconductor substrate, such as an unpatterned semiconductor or one having a pattern, a semiconductor device, various packages for various levels of interconnection, including a single-chip wafer or a multiple-chip wafer, a substrate for a light emitting diode (LED), or other assemblies requiring solder connections.

As used herein, the term "semiconductor substrate" is defined to mean any construction comprising semiconductive material. A semiconductor substrate includes semiconductor devices and any substrate having one or more semiconductor layers or structures which include active or operable portions of semiconductor devices.

As used herein, the term "semiconductor device" refers to a semiconductor substrate upon which at least one microelectronic device has been or is being fabricated.

As used herein, the term "Shore D hardness" is the hardness of a given material as measured according to ASTM D2240-15 (2015), "Standard Test Method for Rubber Property—Durometer Hardness". Hardness was measured on a Rex Hybrid hardness tester (Rex Gauge Company, Inc., Buffalo Grove, Ill.), equipped with a D probe. Six samples were stacked and shuffled for each hardness measurement; and each pad tested was conditioned by placing it in 50 percent relative humidity for five days at 23° C. before testing and using methodology outlined in ASTM D2240-15 (2015) to improve the repeatability of the hardness tests. In the present invention, the Shore D hardness of the polyurethane reaction product of the polishing layer or pad includes the Shore D hardness of that reaction including any additive to lower Shore D hardness.

As used herein, the term "silica particle solids" or "silica solids" means, for a given composition, the total amount of spherical silica particles, plus the total amount of elongated, bent or nodular silica particles, including any component with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "strong acid" refers to protic acids having a pKa of 2 or less, such as inorganic acids such as sulfuric or nitric acid.

As used herein, the term "substantially free of any oxidizer compound" means that a given composition comprises 50 ppm or less, or, preferably, 25 ppm of any oxidizer compound.

As used herein, the term "tunable" or "tunability" refers to a characteristic of CMP compositions determined by the removal rate and the selectivity they exhibit in polishing one material over another, such as high removal of silicon dioxide and low removal or silicon nitride.

As used herein, the term "use conditions" means the temperature and pressure at which a given composition is used, including increases in temperature and pressure during or as a result of use.

As used herein, the term "wt. %" stands for weight percent.

As used herein, the term "zeta potential" or "ZP" refers to the charge of a given composition as measured by a Malvern Zetasizer instrument. All zeta potential measurements were made on slurry compositions as described in the examples. The reported value was taken from an averaged measurement of zeta values using >20 acquisitions taken by the instrument for each indicated composition. In accordance with the present invention, the zeta potential of a silica particle is proportional to the amount of cationic charge on the surface of the silica particle.

In accordance with the methods of the present invention, CMP polishing removes organic polymer films from semiconductor wafers or substrates. The organic polymer films may be spin-on (SOC) or (SOD) films, for example, cross-linked polyarylene ether films, using slurries having low abrasive contents. The CMP polishing composition formulations are simple and are comprised of few and commercially available components and the components are not subject to environmental or safety restrictions. The sulfate group containing anionic surfactant may wet any substrate surface by interaction through the hydrophobic tail of the surfactant molecule, and may attract the cationic silica particle through charge attraction by the negatively charged hydrophilic head of the surfactant. The CMP polishing compositions comprise slurries of cationic silica particles and sulfate group containing surfactant at acidic conditions pH of 1.5 to 4 remove crosslinked polyarylene ether SOC films, for example, with high removal rates so long as the slurry remains below the IEP of the abrasive particle. Because the particle loading of the slurries is low, the defectivity, required cleaning steps, and cost in use are minimized.

In accordance with the methods of the present invention, useful organic polymer films may be made by spin coating in accordance with conventional methods known in the art. The curing of the organic polymer film in accordance with the present invention may be carried out by conventional methods known in the method.

Spin-on coatings for use in lithography applications (SOC) comprise coating layers or organic polymer films that may have an average thickness of from 200 to 2000 nm and are coated on individual dies or patterns; spin on dielectric coatings for use in packaging applications comprise coating layers or organic polymer film that may having an average thickness of from 0.4 to 60 microns and which cover, protect or encapsulate a semiconductor wafer or substrate.

Preferably, after being deposited on a surface, the spin coated organic polymer film is heated (baked) to remove any remaining solvent; this heating may partially cure the resulting film. Curing follows, typically by heating for a period of time. Suitable curing temperatures range from 70 to 375° C. Typically curing times range from 1 to 600 minutes; longer curing times enable the curing of polymers at lower temperatures.

Suitable CMP polishing pads may be any polishing pads, for example, polyurethane foam pads, as are known and conventional in the art, such as, for example, the CMP polishing pads disclosed in Reinhardt et al., U.S. Pat. No. 5,578,362 or Kulp, U.S. Pat. No. 7,445,847 B2.

The CMP compositions useful in accordance with CMP in the methods of the present invention may comprise an abrasive of elongated, bent or nodular silica particles containing one or more cationic nitrogen or phosphorus atoms. Such an abrasive of silica particles can be used in very low solids contents in the methods of the present invention.

Suitable elongated, bent or nodular silica particles are made from suspension polymerization by hydrolytic condensation of silanols formed in a known manner from precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkylamines or KOH, preferably, tetramethylammonium hydroxide; the hydrolytic condensation process may incorporate one or more cationic nitrogen or phosphorus atoms into the elongated, bent or nodular silica particles. Preferably, the elongated, bent or nodular silica particles are cationic at a pH of 4 or less.

Other suitable abrasives of silica particles containing one or more cationic nitrogen atoms may be those silica particles formed in the presence of an aminosilane, such as by adding the aminosilane to a silanol or a precursor thereof at a pH below 6 and conducting sol gel silica formation by adding a basic catalyst, such as caustic. Suitable aminosilanes may be, for example, an aminosilane containing one or more tertiary amine group, such as N,N-(diethylaminomethyl) triethoxysilane (DEAMS), or one or more secondary amine group, such as N-(2-aminoethyl)-3-aminopropyltrimethoxysilane (AEAPS) or N-aminoethylaminoethylaminopropyl trimethoxysilane (DETAPS), preferably, an aminosilane containing one or more tertiary amine group.

Suitable elongated, bent or nodular abrasives of silica particles are available from Fuso Chemical Co., Ltd., Osaka, JP (Fuso) under the tradenames HL-2, HL-3, HL-4, PL-2, PL-3 or BS-2 and BS-3 slurries. The HL and BS series particles from Fuso contain one or more nitrogen atoms which impart a cationic charge at a pH 4 or less.

The CMP polishing compositions useful in the methods of the present invention may contain additional surfactants; however, the amount of surfactant in the CMP polishing compositions useful in the methods of the present invention should be limited to less than 1.0 wt. %, based on the total solids of the CMP polishing compositions. Excessive amounts of surfactants act as a lubricating layer and inhibit the effectiveness of CMP polishing.

The CMP polishing compositions useful in the methods of the present invention preferably do not contain substantial amounts of oxidizers. Oxidizers can cause instability in the compositions containing them.

Suitable organic polymer films useful as spin-on carbon (SOC) coatings in accordance with the methods of the present invention are any useful in lithography applications as sacrificial layers to enable patterning, especially self-aligned quadruple patterning. While local planarization of the polymer film may be achieved through material properties, such as flow, larger scale, such as wafer- and die-scale planarity has proven elusive. Suitable SOC coatings may include cross-linked poly(arylene ether) films for multi-patterning applications. Poly(arylene ether) films are thermally stable at temperatures up to 450° C., offer good etch selectivity due to their high carbon content and gap fill on a local feature scale. In accordance with the methods of the present invention, such cross-linked polyarylene ether films can effectively be planarized on a die scale and a wafer scale.

Suitable organic polymer films useful as spin-on dielectrics (SOD) in accordance with the methods of the present invention are any useful in packaging applications, such as wafer level packing (WLP) applications, employ polymer dielectrics that remain as permanent components of the stack. Preferably, such polymers are partially cured prior to CMP polishing, and undergo an additional step to achieve full cure after CMP polishing.

The resulting spin coating films used as SOCs in accordance with the present invention may be used in photolithography applications.

In accordance with the methods of the present invention, photolithography methods may comprise: (a) forming an organic polymer film over a substrate; (b) forming a topcoat layer over the organic polymer film; (c) exposing the topcoat layer and the organic polymer film to activating radiation through a mask; and (d) contacting the exposed topcoat layer and organic polymer film with a developer to form a lithographic pattern. The topcoat layer (b) can be omitted. As used herein, the term "activating radiation" is any radiation, such as ultraviolet (UV) light which converts the organic polymer film to a form which is soluble in the developer in the case of positive photoresists, or, in the case of negative photoresists, insoluble in the developer. As used herein, the term "mask" is any filter or pattern which protects a portion of the organic polymer film or the organic polymer film and the topcoat having a desired pattern from exposure to the activating radiation.

In accordance with the methods of the present invention in photolithography applications, CMP polishing takes place after any of forming the organic polymer film, exposing the organic polymer film to activating radiation, or both.

The CMP polishing in accordance with the present invention comprises a conventional CMP polishing method. The CMP polishing comprises: providing a CMP polishing apparatus having a platen or table; providing the organic polymer film substrate to be polished; providing a CMP polishing pad, such as a polyurethane foam pad, having a polishing surface; installing onto the platen or table the CMP polishing pad; providing the CMP polishing composition of the present invention at an interface between a polishing surface of the CMP polishing pad and the substrate; and, creating dynamic contact between the CMP polishing pad surface and the substrate, wherein at least some organic polymer film material is removed from the substrate.

In accordance with the methods of the present invention, the methods comprise CMP polishing wherein the creating dynamic contact between the CMP polishing pad surface and the organic polymer film substrate can be by rotating the substrate, rotating the CMP polishing pad having the polishing layer, or rotating both.

In accordance with the methods of the present invention, the methods comprise: CMP polishing with a CMP polishing pad and, separately or at the same time, conditioning the polishing surface of the CMP polishing pad with a conditioning pad so that it has a surface microtexture.

Preferably, in the CMP polishing of the present invention, the creating of dynamic contact between the CMP polishing pad surface and the organic polymer film substrate creates a low down force of from 4 to 40 kPa, or, preferably, less than 6 to 35 kPa.

When spin coating an organic polymer film forming composition, the solids content of the organic polymer liquid coating composition can be adjusted to provide a desired film thickness based upon the specific spinning equipment utilized, the viscosity of the composition, the speed of the spinner and the amount of time allowed for spinning.

Spin coating compositions used in lithography (SOCs) in accordance with the invention are suitably applied to substrates conventionally used in processes involving coating with SOCs. For example, the composition may be applied over inorganic oxides, silicon wafers or silicon wafers that may have been coated with one or more layers to be patterned, for example, one or more of conductive, semiconductor and dielectric layers.

An organic polymer film made by SOC may be dried or at least partially cured and the solvent substantially removed in a single thermal treatment step.

A topcoat composition of the invention can be applied over the SOC organic polymer film by any suitable method known to those knowledgeable in the art, with spin coating being typical; both layers can be heat treated or cured together. The photoresist organic polymer film with a topcoat composition layer is then patternwise exposed to activating radiation for the photoactive component(s) of the photoresist.

Thereafter, the organic polymer film is developed, typically by treatment with an aqueous base developer chosen from: quaternary ammonium hydroxide solutions such as aqueous tetra-alkyl ammonium hydroxide solutions, typically a 2.38 wt % or 5 wt % tetramethylammonium hydroxide aqueous solution; amine solutions such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with methods recognized in the art.

Following development of the photoresist coating over the substrate, the developed substrate may be selectively processed on those areas bared of resist, for example, by etching or plating substrate areas bared of resist in accordance with methods known in the art. After such processing, resists may be removed from the processed substrate using known stripping methods.

EXAMPLES

The following examples illustrate the various features of the present invention.

In the Examples that follow, unless otherwise indicated, conditions of temperature and pressure are ambient temperature and standard pressure.

The following materials were used in the Examples that follow:

AEAPS=N-(2-aminoethyl)-3-aminopropyltrimethoxysilane, 98% (Gelest Inc., Morrisville, Pa.); DEAMS=(N,N-diethylaminomethyl)triethoxysilane, 98%, (Gelest Inc.); TMOS=tetramethoxy silane; TMAH=tetramethylammonium hydroxide.

The various silica particles used in the Examples are listed in Table A, below.

TABLE A

Silica particles

| Aqueous Silica Slurry | Source | pH[2] | Particle size (CPS, nm) | Morphology | Raw Materials | Concentration (wt. % solids) | ZP[3] (mV) |
|---|---|---|---|---|---|---|---|
| Slurry A | HL-3[TM,1] | 7.8 | 55 | Elongated, cationic particle | TMOS and TMAH | 20 | 23 |
| Slurry B | BS-3[TM,1] | 7.3 | 53 | Elongated, cationic particle | TMOS and TMAH | 20 | 11 |

[1]Fuso Chemical, Osaka, JP; [2]pH as delivered from source; [3]Measured at pH 3.3.

Removal Rate:

Unless otherwise indicated, removal rate testing from polishing on the indicated substrate was performed using a Strasbaugh 6EC 200 mm wafer polisher or "6EC RR" (Axus Technology Company, Chandler, Ariz.). The Strasbaugh 6EC 200 mm wafer polisher was run at a downforce of 20.7 kPa (3 psi) with a table speed of 93 rpm, carrier speed of 87 rpm. The indicated substrates were polished with the indicated abrasive slurry at a flow rate of 200 mL/min. An IC1010™ pad from Dow Electronic Materials was used for polishing. The 1010™ pad is a polyurethane pad 2.03 mm (80 mils) thick with a shore D hardness of 57 and a 1010 groove pattern (The Dow Chemical Company, Midland, Mich., (Dow)). An AK45 AM02BSL8031C1-PM diamond pad conditioner (SAESOL Diamond Ind. Co. Ltd., Asan, South Korea) was used to condition the polishing pad via 100% in situ conditioning at a downforce of 62.1 kPa (9 lbf) pressure for 20 minutes and was then further conditioned prior to polishing using a down force of 48.3 kPa (7 lbf) for 10 minutes. The removal rates were determined by measuring the film thickness before and after polishing using a KLA-Tencor™ FX200 metrology tool (KLA Tencor, Milpitas, Calif.) using a 49 point spiral scan with a 3 mm edge exclusion.

Example 1

A CMP polishing composition with a bent, elongated silica particle abrasive, Slurry A, was tested and the results are indicated in Table 1, below. In Table 1, below, the substrate polished was a 200 mm diameter bare silicon wafer coated with a OPTL™ type crosslinked poly(arylene ether) (The Dow Chemical Company, Midland, Mich. (Dow)) spin coated (SOC) film at about 5000 Ang. thickness and cured at 350° C. for 1 min. The SOC films were polished for 60 seconds. One wafer was tested per trial.

TABLE 1

Various Surfactants and Polymer Removal Rate

| Slurry A particle Concentration (wt. %) | Additive | Additive Concentration (ppm) | SOC RR,* 350° C./60 sec (Å/min) |
|---|---|---|---|
| 1 | Ammonium Lauryl Sulfate | 500 | >5000 |
| 0.5 | Ammonium Lauryl Sulfate | 500 | >5000 |
| 1 | Dodecyl-trimethylammonium Chloride | 500 | 166 |
| 1 | — | — | 203 |
| 2 | — | — | 564 |
| 5 | — | — | 348 |

*Rate values are calculated based on measurements within a 50 mm radius of the wafer center.

As shown in Table 1, above, the sulfate group containing surfactant was shown to enhance organic polymer film removal rate by elongated, bent silica particle containing slurries at low solids contents. Further, a 0.5 wt. %, solids content of the abrasive silica particle was as effective as a larger solids content of the same. In contrast, cationic surfactants did not help organic polymer film removal rate.

Example 2: Effect of Sulfate Group Containing Surfactant Concentration on Polymer Vs. Oxide and Nitride Removal Rate The substrates tested were 200 mm diameter bare silicon wafers having deposited thereon TEOS (silicon dioxide) or SiN dielectric, or which were spin coated with a 5000 Ang. thick layer of OPTL™ type cross-linked poly(arylene ether) (Dow) baked at 350° C./60 sec. One wafer having one of the SOC coating, the SiN deposited layer thereon or the TEOS layer deposited thereon was tested per trial. The SOC films were polished for 15 seconds. The results are shown in Table 2, below.

TABLE 2

Removal Rates with Varying Abrasive and Surfactant Concentration

| Slurry A (wt. %) | Ammonium Lauryl Sulfate (ppm) | Silica: Surfactant Ratio | SOC RR* (Å/min) | TEOS RR (Å/min) | SiN RR (Å/min) |
|---|---|---|---|---|---|
| 0.05 | 100 | 5 | 885 | −204 | 46 |
|  | 200 | 2.5 | 661 | 345 | 38 |
| 0.1 | 100 | 10 | 1455 | 194 | 98 |
|  | 200 | 5 | 1231 | 131 | 57 |
| 0.2 | 100 | 20 | 1075 | 416 | 80 |
|  | 200 | 10 | 2301 | 307 | 67 |
|  | 500 | 4 | >5000 | 110 | 81 |
| 0.3 | 100 | 30 | 470 | 624 | 66 |
|  | 200 | 15 | 1847 | 483 | 272 |
|  | 500 | 6 | >5000 | 187 | 130 |
|  | 1000 | 3 | 2707 | 53 | 61 |

*Rate values are calculated based on measurements within a 50 mm radius of the wafer center.

As shown in Table 2, above, an elongated, bent or nodular silica particle abrasive (in the amount of 500 ppm) to sulfate group containing surfactant (concentration of 200 ppm or 0.02 wt. % solids) of 2.5:1 or above impairs polishing; however, a 10:1 solids weight ratio where 0.2 wt. % solids of the silica particle is used provides excellent removal rate and selectivity of polymer over oxide and nitride. Likewise, a 6:1 solids weight ratio where 0.3 wt. % solids of the silica particle is used provides excellent removal rate and selectivity of polymer over oxide and nitride. At a 30:1 weight ratio of abrasive to surfactant, however, even 0.3 wt. % solids of silica gives diminished polymer removal rate but excellent selectivity. This example demonstrates that in the methods of the present invention, the CMP compositions enable good tunability with regard to removal rate and selectivity for polymer removal over removal of oxide or nitride.

Example 3: Effect of Sulfate Group Containing Surfactant Concentration on Polymer Vs. Oxide and Nitride Removal Rate The substrates tested were a 200 mm diameter bare silicon wafer having deposited thereon a TEOS (silicon dioxide) layer, or which was spin coated with a 5000 Ang. thick SOC of layer of OPTL™ type cross-linked poly(arylene ether) (Dow) baked at 350° C./60 sec. The SOC films were polished for 15 seconds. One wafer having each kind of coating or deposited layer was tested per trial. The results are shown in Table 3, below.

TABLE 3

Removal Rates with Varying Abrasive and Surfactant Concentration

| Slurry B (wt. %) | Ammonium Lauryl Sulfate (ppm) | Silica: Surfactant Ratio | SOC RR* (Å/min) | TEOS RR (Å/min) | SOC:TEOS Selectivity |
|---|---|---|---|---|---|
| 0.2 | 100 | 20 | 626 | 196 | 3.2 |
|  | 250 | 8 | 395 | 103 | 3.8 |
| 0.5 | 100 | 50 | 1341 | 619 | 2.2 |
|  | 250 | 20 | 816 | 288 | 2.8 |
|  | 500 | 10 | 414 | 124 | 3.3 |
|  | 1000 | 5 | 926 | 66 | 14.0 |
| 1 | 100 | 100 | 1168 | 1109 | 1.1 |
|  | 250 | 40 | 1257 | 658 | 1.9 |
|  | 500 | 20 | 974 | 331 | 2.9 |
|  | 1000 | 10 | 841 | 149 | 5.6 |
| 3 | 100 | 300 | 122 | 2011 | 0.1 |
|  | 250 | 120 | 1015 | 1585 | 0.6 |
|  | 500 | 60 | 2869 | 988 | 2.9 |
|  | 1000 | 30 | 851 | 429 | 2.0 |

*Rate values are calculated based on measurements within a 50 mm radius of the wafer center.

As shown in Table 3, above, the ratio of cationic silica particle abrasive to sulfate group containing surfactant controls the removal rate and selectivity of CMP polishing. That is, for each silica particle abrasive concentration, an optimum surfactant concentration exists in which organic polymer film removal rate may be maximized and selectivity may be tuned. This example demonstrates that in the methods of the present invention, the CMP compositions with cationic silica particle enable reasonable tunability of removal rate and selectivity of removing one substrate material as opposed to another.

Example 4

To show the effect of surfactant chain length, an abrasive of an elongated, bent or nodular silica particle was tested with various surfactants of increasing carbon chain length. The substrate polished was a 200 mm diameter bare silicon wafer having deposited thereon a TEOS (silicon dioxide) layer or a silicon nitride layer, or was then spin coated with OPTL™ type crosslinked poly(arylene ether) (The Dow Chemical Company, Midland, Mich. (Dow)) spin coated (SOC) film at about 5000 Ang. thickness and cured at 350° C. for 1 min. The SOC films were polished for 15 seconds. One wafer having each kind of layer coated or deposited thereon was tested per trial. Results are shown in Table 4, below.

TABLE 4

Removal Rate and Surfactant Chain Length

| Slurry A (wt. %) | Surfactant | Carbon Chain Length | Surfactant Concentration (ppm) | SOC RR* (Å/min) | TEOS RR (Å/min) | SiN RR (Å/min) |
|---|---|---|---|---|---|---|
| 0.2 | Sodium Octyl Sulfate | $C_8$ | 100 | 74 | 422 | 12 |
|  |  |  | 200 | 5610** | 342 | 13 |
|  | Sodium Decyl Sulfate | $C_{10}$ | 100 | 122 | 450 | 15 |
|  |  |  | 200 | 421 | 375 | 14 |
|  | Sodium Dodecyl Sulfate | $C_{12}$ | 100 | 668 | 440 | 8 |
|  |  |  | 200 | 1412 | 356 | 9 |
|  | Sodium Tetradecyl Sulfate | $C_{14}$ | 100 | 2416 | 395 | 30 |
|  |  |  | 200 | 10773 | 288 | 12 |
|  | Sodium Octadecyl Sulfate | $C_{18}$ | 100 | >20000 | 292 | 23 |
|  |  |  | 200 | >20000 | 311 | 24 |

*Rate values are calculated based on measurements within a 50 mm radius of the wafer center.
**Result affected by extensive delamination.

As shown in Table 4, above, only a small amount of the elongated, bent or nodular silica particle abrasive gives good removal rate and a longer chain surfactant gives dramatically better results.

Example 5: Other Organic Polymer Film Applications

CMP polishing compositions of Slurry A/ammonium lauryl sulfate slurries. The substrate polished was a 200 mm diameter bare silicon wafer having deposited thereon TEOS or SiN or a 200 mm diameter bare silicon wafer spin coated with 80% Novolac/20% MMA SOC film baked at 240° C./60 sec. The SOC organic polymer films were polished for 60 seconds with Slurry A only, and for 30 seconds with Slurry A/ammonium lauryl sulfate. One wafer was tested per trial.

TABLE 5

Other Organic Polymer Film Applications and Tunability

| Particle | Particle Concentration (wt. %) | Surfactant | Surfactant Concentration (ppm) | SOC RR* (Å/min) | TEOS RR (Å/min) | SiN RR (Å/min) |
|---|---|---|---|---|---|---|
| Slurry A | 0.3 | *— | — | *1251 | *957 | *19 |
|  |  | Ammonium Lauryl Sulfate | 100 | 5927 | 630 | 12 |
|  |  |  | 200 | 3494 | 460 | 33 |
|  |  |  | 500 | 1430 | 186 | 14 |
|  |  |  | 1000 | 559 | 21 | 11 |

*Denotes Comparative Example.

As shown in Table 5, above, the methods of the present invention enable tunable CMP compositions that can stop on SiN, oxide, or polish both oxide and nitride.

We claim:
1. A method comprising: Spin coating to form an organic polymer liquid on a semiconductor wafer or substrate;
at least partially curing the spin coating to form an organic polymer film at a temperature ranging from 70 to 375° C.; and, chemical mechanical polishing (CMP polishing) the organic polymer film with a polishing pad and an aqueous CMP polishing composition comprising from 0.05 to 7 wt. %, based on total CMP polishing composition solids, of an abrasive of elongated, bent or nodular silica particles containing within at least one of the silica particles one or more cationic nitrogen or phosphorus atoms, from 0.005 to 0.5 wt. %, based on total CMP polishing composition solids, of a sulfate group containing surfactant which further contains a $C_8$ to $C_{18}$ alkyl or alkenyl group, and a pH adjusting agent, the CMP polishing composition having a pH ranging from 1.5 to 4.5 wherein the pH is below the isoelectric point (IEP) of the silica particles.

2. The method as claimed in claim 1, wherein the CMP polishing composition comprises from 0.1 to 4 wt. %, based on total CMP composition solids, of an abrasive of silica particles containing within at least one of the silica particles one or more cationic nitrogen or phosphorus atoms.

3. The method as claimed in claim 1, wherein the CMP polishing composition comprises an abrasive of silica particles containing within at least one of the silica particles one or more cationic nitrogen atoms.

4. The method as claimed in claim 1, wherein the CMP polishing composition comprises an abrasive of silica particles containing within at least one of the silica particles one or more cationic nitrogen or phosphorus atoms and having a zeta potential (ZP) at a pH of 3.3 of from 8 to 50 mV.

5. The method as claimed in claim 1, wherein the CMP polishing composition comprises from 0.01 to 0.1 wt. %, based on total CMP composition solids, of a sulfate group containing surfactant which further contains a $C_8$ to $C_{18}$ alkyl or alkenyl group.

6. The method as claimed in claim 1, wherein the organic polymer film is a spin-on coating (SOC) used in a lithography application and the method further comprises:
(a) exposing the polished organic polymer film to activating radiation through a mask; and,
(b) contacting the organic polymer film layer with a developer to form a lithographic pattern, wherein the CMP polishing takes place either prior to or after the (a) exposing.

7. The method as claimed in claim 1, wherein the organic polymer film comprises a polymer chosen from a polyarylene, a polyarylene ether, a cross-linked polyarylene, a cross-linked polyarylene ether, a novolac, a polyimide, a polybenzoxazole or a phenolic epoxy.

8. The method as claimed in claim 1, wherein the semiconductor wafer or substrate additionally comprises an inorganic oxide; an inorganic oxide and a conductive layer; an inorganic oxide and a dielectric; or an inorganic oxide, a dielectric and a conductive layer.

9. The method as claimed in claim 1, wherein the organic polymer film is a spin-on dielectric (SOD) that is spin coated on an electronic packaging substrate comprising an inorganic oxide and/or a conductive layer.

10. The method as claimed in claim 9, wherein the organic polymer film is chosen from a polyimide, an epoxy, or a polybenzoxazole and, further wherein, the curing of the organic polymer film comprises partially curing at a temperature of from 80 to 180° C. for 30 seconds to 20 minutes, followed by CMP polishing the organic polymer film, and, then fully curing the organic polymer film after CMP polishing the substrate.

* * * * *